(12) United States Patent
Ukon

(10) Patent No.: US 6,577,547 B2
(45) Date of Patent: Jun. 10, 2003

(54) SEMICONDUCTOR MEMORY DEVICE

(75) Inventor: Isamu Ukon, Chiba (JP)

(73) Assignee: UMC Japan, Tateyama (JP)

( * ) Notice: Subject to any disclaimer, the term of this patent is extended or adjusted under 35 U.S.C. 154(b) by 0 days.

(21) Appl. No.: 10/035,189

(22) Filed: Jan. 4, 2002

(65) Prior Publication Data

US 2002/0093874 A1 Jul. 18, 2002

(51) Int. Cl.$^7$ ................................................ G11C 7/00
(52) U.S. Cl. ...................................... 365/201; 365/236
(58) Field of Search ................................. 365/201, 236

(56) References Cited

U.S. PATENT DOCUMENTS 6,462,996 B2 * 10/2002 Ooishi ........................ 365/201
6,470,467 B2 * 10/2002 Tomishima et al. ......... 714/744

OTHER PUBLICATIONS

Betty Prince, "Semiconductor Memories", 1983, Wiley, $2^{nd}$ edition, pp. 711–712.*

* cited by examiner

*Primary Examiner*—M. Tran
(74) *Attorney, Agent, or Firm*—Crowell & Moring LLP

(57) ABSTRACT

The invention provides a semiconductor memory device capable of performing a memory function test without using an expensive tester.

When a test enable signal is inputted, a controller 21 makes first selectors 23*a* and 23*b* and a second selector 24 select respectively an internal row address signal, an internal column address signal and internal data obtained by utilizing a signal from a counter 22, and thereby writes internal data into each memory cell on the basis of the internal row address signal and the internal column address signal and thereafter reads data from each memory cell on the basis of the internal row address signal and the internal column address signal. A comparator 25 compares data read from each memory cell at the time of a data reading operation with expected value data obtained by utilizing a signal issued from the counter 22 at the time of the said read operation, and outputs the result of comparison.

4 Claims, 1 Drawing Sheet

F I G. 1
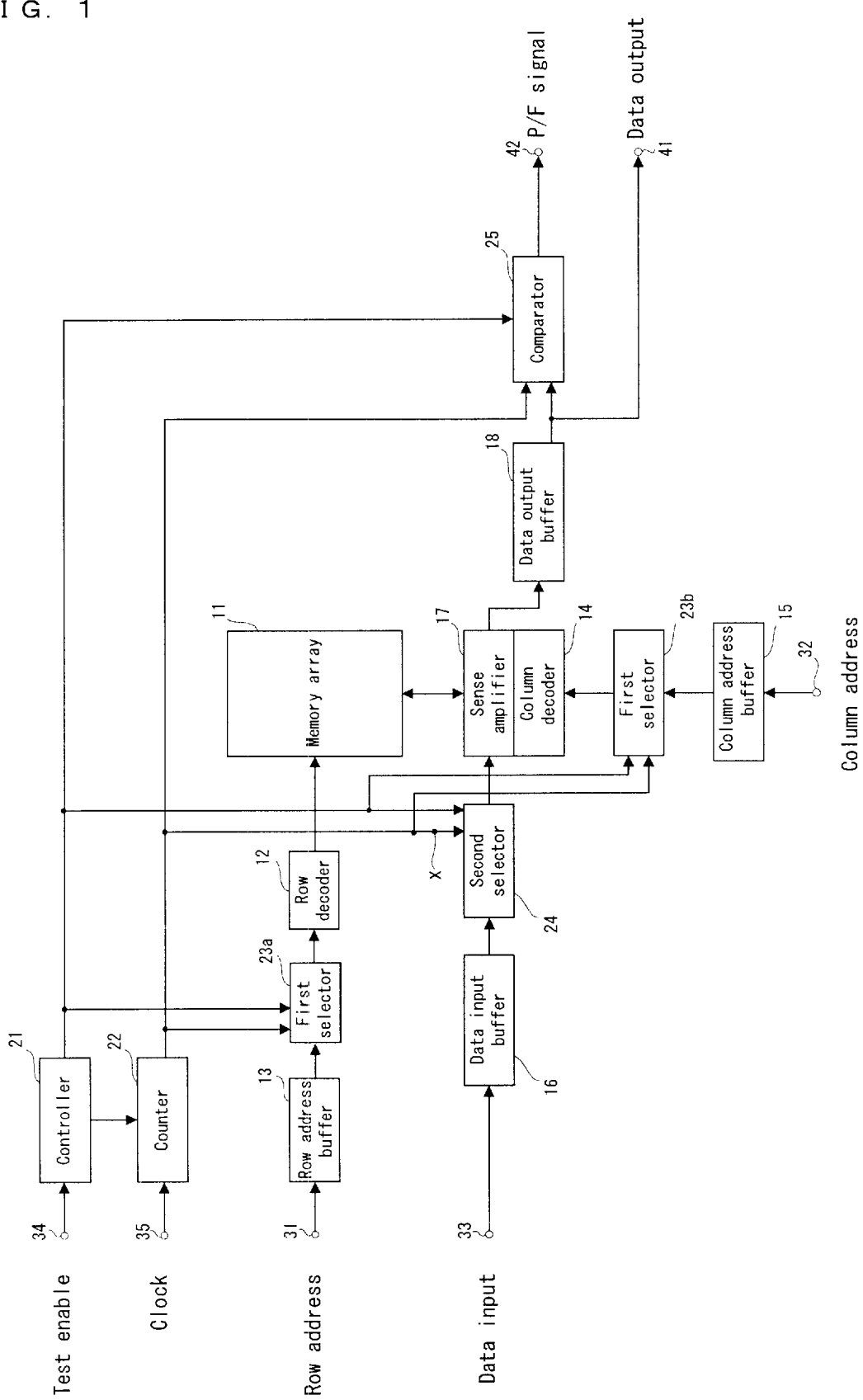

SEMICONDUCTOR MEMORY DEVICE

BACKGROUND OF THE INVENTION

1. Field of the Invention

The present invention relates to a semiconductor memory device such as a RAM and the like capable of reading and writing data.

2. Prior Art

Up to now, after a semiconductor memory device has been manufactured the semiconductor memory device is evaluated in function using a memory tester, and thereby it is judged whether the semiconductor memory device is acceptable or defective. Such a memory tester has a probe card and a tester main body. The probe card has conductive needles arranged correspondingly to the arrangement of terminals of a semiconductor memory device in order to be connected with the respective terminals of the semiconductor memory device. The tester main body comprises an algorithmic pattern generator (ALPG) and a comparator. The ALPG generates in order an address signal corresponding to a memory cell to have data read from or written to it and expected value data to be expected when reading data written into a memory cell corresponding to each address, and the like. The comparator compares data read from a memory cell corresponding to each address with expected value data corresponding to the relevant address.

A test using a memory tester is performed in the following manner. First, the needles of a probe card are brought into contact with the terminals of a semiconductor memory device. Next, a tester main body sends address signals and test data to the semiconductor memory device through the probe card from an ALPG and thereby writes data into memory cells corresponding to the respective addresses. After this, the tester main body reads the data written into the respective memory cells. And the comparator judges whether or not the data obtained in a read operation coincide with the written data, namely, expected value data. When they coincide with each other, the said semiconductor memory device is determined to be acceptable, and when they do not coincide, the said semiconductor memory device is determined to be defective.

By the way, the larger the memory capacity of a semiconductor memory device is made, the more expensive a memory tester to be used in function test of the semiconductor memory device is made. The reason is that an ALPG of the memory tester is made larger in capacity and further its test speed needs to be made higher. And it is because since the number of needles of the probe card is increased, its manufacturing cost is made higher. Due to this, it is desired to realize a semiconductor memory device capable of performing a memory function test without using an expensive memory tester.

The present invention has been performed on the basis of the above circumstances, and an object of the invention is to provide a semiconductor memory device capable of performing a memory function test without using an expensive memory tester.

SUMMARY OF THE INVENTION

In order to attain the above object, the present invention is characterized by a semiconductor memory device capable of reading and writing data, comprising a counter circuit for generating a signal having a specific bit width each time a clock signal is inputted, a first selector circuit for selecting and sending one of an external address signal inputted from the outside and an internal address signal obtained by utilizing a signal from said counter circuit to a decoder, a second selector circuit for selecting and taking one of external data inputted from the outside and internal data obtained by utilizing a signal from said counter circuit as data to be written to a memory area corresponding to a specific address, a control circuit which makes said first selector circuit select said internal address signal and makes said second selector circuit select said internal data in case that a signal for performing a self-diagnostic test in relation to a memory function is inputted, and thereby writes said internal data sent from said second selector circuit into a memory area corresponding to an address specified by said internal address signal each time said internal address signal is sent from said first selector circuit and, after it has written data into every memory area, reads data from a memory area corresponding to an address specified by said internal address signal each time said internal address signal is sent from said first selector circuit, and a comparator circuit which compares data read from each memory area at the time of a data reading operation by said control circuit with expected value data obtained by utilizing a signal issued from said counter circuit at the time of the said read operation, and outputs, the result of comparison.

And in order to attain the above object, the present invention is characterized by a semiconductor memory device capable of reading and writing data, comprising; a counter circuit for generating a signal having a specific bit width each time a clock signal is inputted, a first selector circuit for selecting and sending one of an external address signal inputted from the outside and an internal address signal obtained by utilizing a signal from said counter circuit to a decoder, a second selector circuit for selecting and taking one of external data inputted from the outside and internal data obtained by utilizing a signal from said counter circuit as data to be written to a memory area corresponding to a specific address, a control circuit which makes said first selector circuit select said internal address signal and makes said second selector circuit select said internal data in case that a signal for performing a self-diagnostic test in relation to a memory function is inputted, and thereby writes said internal data sent from said second selector circuit into a memory area corresponding to an address specified by said internal address signal each time said internal address signal is sent from said first selector circuit and, after it has written data into every memory area, reads data from a memory area corresponding to an address specified by said internal address signal each time said internal address signal is sent from said first selector circuit, a first output terminal for outputting data read from each memory area, and a second output terminal for outputting expected value data obtained by utilizing a signal issued from said counter circuit at the time of a data reading operation by said control circuit.

BRIEF DESCRIPTION OF THE DRAWING

FIG. 1 is a schematic composition diagram of a semiconductor memory device being an embodiment of the present invention.

DETAILED DESCRIPTION OF THE PREFERRED EMBODIMENT

An embodiment of the present invention is described with reference to the drawing in the following. FIG. 1 is a schematic composition diagram of a semiconductor memory device being an embodiment of the present invention.

As shown in FIG. 1, such a semiconductor memory device has a memory array 11, a row decoder 12, a row address buffer 13, a column decoder 14, a column address buffer 15, a data input buffer 16, a sense amplifier 17, a data output buffer 18, a self-diagnostic test controller (control circuit) 21, a counter (counter circuit) 22, two first selectors (first selector circuits) 23a and 23b, a second selector (second selector circuit) 24, a comparator (comparator circuit) 25, and a plurality of input/output terminals. As input terminals it has a row address input terminal 31, a column address input terminal 32, a data input terminal 33, a test enable signal input terminal 34, and a clock signal input terminal 35. And as output terminals it has a data output terminal (first output terminal) 41 and a P/F signal output terminal (second output terminal) 42.

The memory array 11 has a number of memory cells arranged in the shape of a matrix. The row decoder 12 selects memory cells in an arbitrary row out of the memory array 11, and the column decoder 14 selects memory cells in an arbitrary column out of the memory array 11. Accordingly an arbitrary memory cell can be selected by the row decoder 12 and the column decoder 14.

The row address buffer 13 amplifies a row address signal inputted from the row address input terminal 31 to a signal level to be internally used. A row address signal amplified by the row address buffer 13 is sent through the first selector 23a to the row decoder 12. And the column address buffer 15 amplifies a column address signal inputted from the column address input terminal 32 to a signal level to be internally used. A column address signal amplified by the column address buffer 15 is sent through the first selector 23b to the column decoder 14. In the following description, a row address signal inputted from the row address input terminal 31 is also referred to as an "external row address signal" and a column address signal inputted from the column address input terminal 32 is also referred to as an "external column address signal".

The data input buffer 16 amplifies data inputted from the data input terminal 33 when writing the data. Hereupon, data inputted from the data input terminal 33 are also referred to as "external data". External data amplified by the data input buffer 16 are sent through the second selector 24 to the sense amplifier 17 and are written into a memory cell corresponding to a specific address of the memory array 11. And the sense amplifier 17 detects and amplifies data taken from the memory array 11 when reading the data. The data amplified by this sense amplifier 17 are sent to the data output buffer 18. The data output buffer 18 amplifies the read data, and outputs them to the data output terminal 41 and sends them to the comparator 25.

In addition to the above-mentioned ordinary semiconductor memory device circuit composition, a self-diagnostic test circuit for automatically judging whether or not its own memory function is normal is built in a semiconductor memory device of this embodiment. This self-diagnostic test circuit comprises a controller 21, a counter 22, first selectors 23a and 23b, a second selector 24, and a comparator 25. Hereupon, a conventional semiconductor memory device may be provided with a counter in order to realize a burst operation and the like, but in this embodiment the counter 22 is used in order to realize a different function from a burst operation.

The counter 22 generates a signal having a specific bit width each time a clock signal is inputted from the clock signal input terminal 35. This signal represents the number of inputted clock signals. Utilizing a signal from the counter 22, a row address signal, a column address signal and data as a test pattern are internally obtained and are used in a self-diagnostic test. In the following, a row address signal and a column address signal obtained by utilizing a signal from the counter 22 are respectively also referred to as an "internal row address signal" and an "internal column address signal", and data obtained by utilizing a signal from the counter 22 are also referred to as "internal data". An internal row address signal is sent to the first selector 23a and an internal column address signal is sent to the first selector 23b. And internal data are sent to the second selector 24 and the comparator 25.

Each of the selectors 23a, 23b and 24 changes over input from the outside and input from the inside to each other. That is to say, the first selector 23a selects and sends one of an external row address signal and an internal row address signal to the row decoder 12. The first selector 23b selects and sends one of an external column address signal and an internal column address signal to the column decoder 14. And the second selector 24 selects either of external data and internal data. Data selected by the second selector 24 are taken as data to be written into an memory area corresponding to a specific address and are sent to the sense amplifier 17. The selectors 23a, 23b and 24 are controlled by the controller 21, and an internal row address signal, an internal column address signal and internal data are respectively selected at the time of a self-diagnostic test.

The controller 21 performs a self-diagnostic test related to a memory function when a test enable signal is inputted from the test enable signal input terminal 34. When a self-diagnostic test is started, the controller 21 controls the selector 23a, 23b and 24 so as to make the first selectors 23a and 23b select respectively an internal row address signal and an internal column address signal, and so as to make the second selector 24 select internal data. And each time a signal is issued from the counter 22, the controller 21 writes the relevant internal data into a memory cell corresponding to an address specified by the relevant internal row address signal and internal column address signal. After it has written internal data into every memory cell, it reads data from a memory cell corresponding to an address specified by the relevant internal row address signal and internal column address signal each time a signal is issued from the counter 22.

The comparator 25 compares data read from the memory array 11 at the time of a data reading operation in a self-diagnostic test with internal data obtained by utilizing a signal from the counter 22 in the said read operation. The result of comparison is outputted as a P/F (Pass/Fail) signal to the P/F signal output terminal 42.

Next, operation of a self-diagnostic test in a semiconductor memory device of this embodiment is described. Here, as an example, it is assumed that a semiconductor memory device having a memory array 11 of 4×4 bits and its output of 4 bits in composition is used.

After a semiconductor memory device has been manufactured, a working person performs a self-diagnostic test in order to inspect whether or not the semiconductor memory device has an expected memory function. In this case the working person sets a specific memory tester onto the semiconductor memory device. Concretely, the respective needles of this memory tester are brought into contact with the test enable signal input terminal 34, the clock signal input terminal 35 and the P/F signal output terminal 42 of the semiconductor memory device. It is enough that this memory tester has a function of generating a test enable signal and a clock signal, and a function of monitoring the test result. That is to say, it does not need to be provided with an advanced pattern generator, many comparators and the like differently from a conventional memory tester, but a working person can perform a test using an inexpensive memory tester having a small number of pins.

When a memory tester outputs a test enable signal and a clock signal, and the controller 21 of a semiconductor memory device receives the enable signal through the enable signal input terminal 34, a self-diagnostic test is started. For example, by determining a specific code in advance instead of using an enable signal, a self-diagnostic test may be started when the controller 21 receives that code.

When a self-diagnostic test is started, the controller 21 performs a write operation of writing internal data into a memory cell corresponding to each address of the memory array 11 and then performs a read operation of reading data written into a memory cell corresponding to each address. These operations are concretely described.

In a write operation the controller 21 sends first a signal to the counter 22. By this the counter 22 starts a counting operation on the basis of a clock signal inputted from the clock signal input terminal 35 and generates a signal having a specific bit width (count value). Here, as an example, it is assumed that a counter 22 generating a signal of 4 bits is used. Now, it is assumed that the respective bits of a count value of the counter 22 are C3, C2, C1 and C0. When the counter 22 receives a signal from the controller 21 and then receives the first clock signal, it resets the count value (C3, C2, C1, C0) to the initial values (0, 0, 0, 0). Next, when the second clock signal is inputted, the counter 22 increments the count value to (0, 0, 0, 1). After this, each time a clock signal is inputted, the counter 22 increments the count value to change over the count value to (0, 0, 1, 0), (0, 0, 1, 1), (0, 1, 0, 0), (0, 1, 0, 1), (0, 1, 1, 0), (0, 1, 1, 1), . . . , (1, 1, 1, 1) in order. Hereupon, when the counter 22 increments the count value (1, 1, 1, 1), the counter value returns to the initial value (0, 0, 0, 0).

A signal (count value) issued by the counter 22 in this way is sent to the selectors 23a, 23b and 24. The first selector 23a sends a signal obtained by utilizing a signal from the counter 22 to the row decoder 12 as an internal row address signal, and the first selector 23b sends a signal obtained by utilizing a signal from the counter 22 to the column decoder 14 as an internal column address signal. And the second selector 24 sends a signal obtained by utilizing a signal from the counter 22 to the sense amplifier 17 as internal data. Thus, each time an internal row address signal and an internal column address signal are respectively sent from the first selectors 23a and 23b, internal data for a test are written into a memory cell corresponding to an address specified by the internal row address signal and the internal column address signal.

Hereupon it is assumed that this embodiment uses for example the following signals as the above-mentioned "signals obtained by utilizing". That is to say, the upper two bits (C3, C2) out of the above signal of 4 bits (C3, C2, C1, C0) in the first selector 23a and the lower two bits (C1, C0) out of the above signal of 4 bits (C3, C2, C1, C0) in the first selector 23b are respectively taken as "signals obtained by utilizing". And the lowest bit C0 out of the above signal of 4 bits (C3, C2, C1, C0) in the second selector 24 is taken as a "signal obtained by utilizing".

As a "signal obtained by utilizing", various signals are conceivable in addition to the above example. For example, a 2-bit signal (C3, C2) out of the signal (C3, C2, C1, C0) from the counter 22 can be used as a "signal obtained by utilizing" for the first selector 23a and a 2-bit signal (C1, C0) can be used as a "signal obtained by utilizing" for the first selector 23a. And a highest-bit signal C3 out of the signal (C3, C2, C1, C0)) from the counter 22 can be used as a "signal obtained by utilizing" for the second selector 24. In such a way, a "signal obtained by utilizing" can be obtained by assigning specified bits of a signal from the counter 22, and it can be freely determined what bits are assigned to the respective selectors 23a, 23b and 24. And in case of using a large counter generating a signal having a bit width of 5 bits or more, a signal obtained by freely combining desired bits of a signal from the counter 22 can be used as a "signal obtained by utilizing" for the respective selectors 23a, 23b and 24.

When the controller 21 finishes a write operation, then it performs a read operation. The controller 21 sends first a signal to the counter 22. By this the counter 22 resets a count value and then starts a counting operation on the basis of a clock signal inputted from the clock terminal 35 and generates a signal having a specific bit width. And in the same way as a write operation, the first selector 23a sends a signal obtained by utilizing a signal from the counter 22 to the row decoder 12 as an internal row address signal, and the first selector 23b sends a signal obtained by utilizing a signal from the counter 22 to the column decoder 14 as an internal column address signal. Thus, each time an internal row address signal and an internal column address signal are sent from the first selectors 23a and 23b, data is read from a memory cell corresponding to an address specified by the internal row address signal and the internal column address signal. The data read in such a way are sent to the comparator 25 as data of 4 bits through the data output buffer 18.

And in addition to data read from the memory array 11, data having a specific bit width obtained by utilizing a signal from the counter 22 is inputted into the comparator 25 at a specific timing. This data is the same as data of 4 bits obtained by collecting 4 pieces of internal data written into each memory cell, and is used as expected value data in data comparison. The comparator 25 compares data of 4 bits sent from the data output buffer 18 with the expected value data. This comparison operation is performed each time data of 4 bits is sent from the data output buffer 18. And when as the result of comparison data read from the memory array 11 and expected value data coincide all with each other, the comparator 25 outputs a P (Pass) signal "0" to the P/F signal output terminal 42, and when read data and the expected value data do not coincide with each other, it outputs an F (Fail) signal "1" to the P/F signal output terminal 42. Thus, a P/F signal may be data of 1 bit.

On the other hand, the memory tester monitors a P/F signal sent through the P/F signal output terminal 42. A working person judges whether the relevant semiconductor memory device is acceptable or defective on the basis of the result. A self-diagnostic test of a semiconductor memory device is finished as described above.

In case of performing a self-diagnostic test in a semiconductor memory device of this embodiment, the controller makes the first selectors select an internal row address signal and an internal column address signal and makes the second selector select internal data, and thereby writes internal data into a memory area corresponding to an address specified by the internal row address signal and the internal column address signal and, after it has written data into every memory cell, reads data from a memory cell corresponding to an address specified by the internal row address signal and the internal column address signal. And the comparator compares data read from each memory cell in a data reading operation with expected value data obtained by utilizing a signal issued from the counter at the time of the said read operation, and outputs the result of comparison. Due to this, a memory tester for performing a function test on a semiconductor memory device of this embodiment does not need to have an advanced pattern generator, many comparators and the like and can do with a probe card having a small number of needles. Therefore, a semiconductor memory device of this embodiment can perform a memory function test without using an expensive memory tester like that of the prior art.

The present invention is not limited to the above embodiment, but can be variously modified within its essential points.

In the above embodiment, for example, a logic circuit may be provided which, when receiving a specific instruction from the controller, generates data obtained by inverting internal data obtained by utilizing a signal from the counter and sends the inverted data to the second selector 24. Such a logic circuit is provided at a position indicated by X in FIG. 1. This inverted data can be also thought to be internal data obtained by utilizing a signal from the counter in a broad sense.

By changing over whether or not to make this logic circuit perform a process, a self-diagnostic test can be performed in case of writing internal data obtained by utilizing a signal from the counter as they are into a specific memory area of the memory array and in case of writing data obtained by inverting the data into a specific memory area of the memory array. Therefore, a memory function can be checked by writing data of both "0" and "1" into each memory cell of the memory array. And such a logic circuit may be also provided for each of the first selectors 23a and 23b. Due to this, data can be accessed by specifying an address at random.

Particularly, when a logic circuit as described above is provided for each of the selectors 23a, 23b and 24, even in case of using a counter having a not so large bit width, a signal having a desired bit width can be easily made as an internal row address signal, an internal column address signal and internal data by selecting a certain bit of a signal issued from the counter or inverting it.

And in the above embodiment, a case where a comparator is built in a semiconductor memory device has been described, but for example a comparator does not necessarily need to be provided. Thanks to this, there is an advantage that a semiconductor memory device is made simpler in circuit composition. In this case, however, a semiconductor memory device must be provided with an output terminal for expected value data obtained by utilizing a signal from the counter instead of a P/F signal output terminal. And as a memory tester, a tester having a comparator for comparing output data with expected value data results in being used.

According to a semiconductor memory device of the present invention, as described above, in case that a signal for performing a self-diagnostic test related to a memory function is inputted, the control circuit makes the first selector circuit select an internal address signal and makes the second selector circuit select internal data, and thereby writes internal data into a memory area corresponding to an address specified by the internal address signal, and after it has written data into every memory area, the control circuit reads data from a memory area corresponding to an address specified by the internal address signal. And the comparator circuit compares data read from each memory area at the time of a data reading operation by the control circuit with expected value data obtained by utilizing a signal issued from the counter circuit at the time of the said read operation, and outputs the result of comparison. Due to this, a memory tester for performing a function test on a semiconductor memory device of the present invention does not need to have an advanced pattern generator, many comparators and the like and can do with a probe card having a small number of needles. Therefore, a semiconductor memory device of the present invention can perform a memory function test without using an expensive memory tester like that of the prior art.

And according to a semiconductor memory device of the present invention, in case that a signal for performing a self-diagnostic test related to a memory function is inputted, the control circuit makes the first selector circuit select an internal address signal and makes the second selector circuit select internal data, and thereby writes internal data into a memory area corresponding to an address specified by the internal address signal, and after it has written data into every memory area, the control circuit reads data from a memory area corresponding to an address specified by the internal address signal. And it outputs the data read from each memory area to the first output terminal and outputs expected value data obtained by utilizing a signal issued from the counter circuit at the time of a data reading operation by the control circuit to the second output terminal. Due to this, a memory tester for performing a function test on a semiconductor memory device of the present invention does not need to have an advanced pattern generator and the like and can do with a probe card having a small number of needles. Therefore, a semiconductor memory device of the present invention can perform a memory function test without using an expensive memory tester like that of the prior art.

What is claimed is:

1. A semiconductor memory device capable of reading and writing data, comprising;

a counter circuit for generating a signal having a specific bit width each time a clock signal is inputted, a first selector circuit for selecting and sending one of an external address signal inputted from the outside and an internal address signal obtained by utilizing a signal from said counter circuit to a decoder, a second selector circuit for selecting and taking one of external data inputted from the outside and internal data obtained by utilizing a signal from said counter circuit as data to be written to a memory area corresponding to a specific address, a control circuit which makes said first selector circuit select said internal address signal and makes said second selector circuit select said internal data in case that a signal for performing a self-diagnostic test in relation to a memory function is inputted, and thereby writes said internal data sent from said second selector circuit into a memory area corresponding to an address specified by said internal address signal each time said internal address signal is sent from said first selector circuit and, after it has written data into every memory area, reads data from a memory area corresponding to an address specified by said internal address signal each time said internal address signal is sent from said first selector circuit, and a comparator circuit which compares data read from each memory area at the time of a data reading operation by said control circuit with expected value data obtained by utilizing a signal issued from said counter circuit at the time of the said read operation, and outputs the result of comparison.

2. A semiconductor memory device according to claim 1, further comprising;

a logic circuit for generating and sending data obtained by inverting said internal data obtained by utilizing a signal issued from said counter circuit to said second selector circuit, when receiving a specific instruction from said control circuit.

3. A semiconductor memory device capable of reading and writing data, comprising;

a counter circuit for generating a signal having a specific bit width each time a clock signal is inputted, a first selector circuit for selecting and sending one of an external address signal inputted from the outside and an internal address signal obtained by utilizing a signal from said counter circuit to a decoder, a second selector circuit for selecting and taking one of external data inputted from the outside and internal data obtained by utilizing a signal from said counter circuit as data to be written to a memory area corresponding to a specific address, a control circuit which makes said first selector circuit select said internal address signal and makes said second selector circuit select said internal data in case that a signal for performing a self-diagnostic test in relation to a memory function is inputted, and thereby writes said internal data sent from said second selector circuit into a memory area corresponding to an address specified by said internal address signal each time said internal address signal is sent from said first selector circuit and, after it has written data into every memory area, reads data from a memory area corresponding to an address specified by said internal address signal each time said internal address signal is sent from said first selector circuit, a first output terminal for outputting data read from each memory area, and a second output terminal for outputting expected value data obtained by utilizing a signal issued from said counter circuit at the time of a data reading operation by said control circuit.

4. A semiconductor memory device according to claim 3, further comprising;

a logic circuit for generating and sending data obtained by inverting said internal data obtained by utilizing a signal issued from said counter circuit to said second selector circuit or said second output terminal, when receiving a specific instruction from said control circuit.

* * * * *